United States Patent [19]
Burton

[11] Patent Number: 4,888,300
[45] Date of Patent: Dec. 19, 1989

[54] SUBMERGED WALL ISOLATION OF SILICON ISLANDS

[75] Inventor: Gregory N. Burton, Burlingame, Calif.

[73] Assignee: Fairchild Camera and Instrument Corporation, Mountain View, Calif.

[21] Appl. No.: 796,041

[22] Filed: Nov. 7, 1985

[51] Int. Cl.⁴ .................. H01L 21/76; H01L 21/302
[52] U.S. Cl. .......................... 437/61; 148/DIG. 50; 148/DIG. 116; 357/49; 357/55; 437/62; 437/67; 437/79; 437/233; 437/239; 437/985
[58] Field of Search ............... 29/576 E, 516 W, 580; 148/187, DIG. 50, 51, 81, 86, 116, 117, 122, 125, 135; 156/633, 644, 647, 657, 628; 357/49, 59, 55, 26, 88; 437/61, 62, 67, 79, 233, 239, 985

[56] References Cited

U.S. PATENT DOCUMENTS

| | | | |
|---|---|---|---|
| 4,021,266 | 5/1977 | Aine | 338/2 |
| 4,353,086 | 10/1982 | Jaccodine et al. | 357/51 |
| 4,419,150 | 12/1983 | Soclof | 148/187 |
| 4,466,180 | 8/1984 | Soclof | 29/580 |
| 4,485,551 | 12/1984 | Soclof | 29/576 W |
| 4,522,682 | 6/1985 | Soclof | 156/647 |
| 4,580,331 | 4/1986 | Soclof | 29/580 |
| 4,584,762 | 4/1986 | Soclof | 29/577 R |
| 4,611,387 | 9/1986 | Soclof | 29/576 W |

FOREIGN PATENT DOCUMENTS

| | | | |
|---|---|---|---|
| 5615494 | 8/1982 | Japan | 156/647 |
| 5728000 | 7/1983 | Japan | 29/576 W |
| 5840893 | 9/1984 | Japan | 29/576 W |
| 2128400 | 7/1983 | United Kingdom | 357/49 |

Primary Examiner—Brian E. Hearn
Assistant Examiner—William D. Bunch
Attorney, Agent, or Firm—Burns, Doane, Swecker & Mathis

[57] ABSTRACT

To completely isolate an island of silicon, a trench is cut into an epitaxial layer to provide access to a differently doped buried layer. While suspending the portion of the epitaxial layer surrounded by the trench by means of an oxide bridge, the underlying region of the buried layer is etched away to form a cavity under the active area. This cavity, as well as the surrounding trench, is then filled with a suitable insulating material to isolate the active island from the substrate.

13 Claims, 5 Drawing Sheets

SUBMERGED WALL ISOLATION OF SILICON ISLANDS

BACKGROUND OF THE INVENTION

The present invention is directed to the isolation of active devices on a silicon chip, and more particularly to the complete isolation of islands of silicon from a substrate material.

As active devices, e.g. transistors, become more closely packed together on a semiconductor chip, it becomes necessary to isolate them from one another so that they do not adversely affect each other's operation. For example, in CMOS technology, it is desirable to isolate the well in which the NMOS transistor is typically formed from the substrate which contains the PMOS transistor, so as to diminish the likelihood of latch-up. In the past, lateral isolation of devices from one another has been accomplished by forming a trench around the island of semiconductor material to be isolated and filling the trench with an insulating material, such as oxide. With this approach, the horizontal flow of charge carriers within the chip is prevented so as to reduce latch-up or similar such adverse conditions.

However, the island is not completely isolated in that it remains in contact with the semiconductor substrate. As the size of active devices becomes increasingly smaller, with a concomitant reduction in the amplitude of the signal conducted thereby, this communication between the active device and the substrate can lead to significant adverse effects. For example, the capacitance between the device and the substrate might be large enough to affect the small amplitude signal conducted by the device. Another factor that takes on increasing importance is ambient radiation. More particularly, alpha particles generate charges when they enter a semiconductor chip. The number of charges is related to the volume of semiconductor material in which the charges are generated. Thus, since the substrate occupies a much larger volume than any of the individual active areas, most of the charges are generated in this portion of the chip.

Accordingly, it is desirable to be able to completely isolate an active island not only laterally from adjacent active areas but also vertically from the substrate on which it is supported. In essence, such isolation involves the formation of an insulating layer beneath the active region as well as around it. In the past, three basic approaches have been suggested for providing an active silicon region on an insulating layer. One of these approaches is the formation of a buried silicon dioxide layer through the implantation of oxygen molecules into the silicon substrate. This technique requires a very heavy oxygen dose which can result in significant damage to the active silicon region overlying the buried oxide layer.

A second approach has been to form the silicon on a sapphire substrate. The sapphire functions as an insulator to isolate the active silicon area from similar such areas. However, the thin silicon film typically contains a high concentration of crystalline defects which are produced during an epitaxial growth process. These defects result in lower carrier mobilities than can be achieved in substrate silicon or in epitaxial silicon films grown on a silicon substrate.

Another suggested approach has been to form V-shaped grooves around the regions to be isolated. These grooves are filled with an oxide and a layer of polysilicon is deposited over the oxide. This structure is then inverted and the silicon which originally formed the bottom of the structure is etched back until the apex of each oxide-filled groove appears. The resulting structure is comprised of regions of silicon which are each completely surrounded by oxide. While this structure has good electrical and mechanical properties, the technique for making it is not production-oriented. More particularly, the etching process must be observed very carefully in order that it be stopped at precisely the right time. As a result, a structure produced by this technique can be relatively expensive and is therefore only practically suited for custom integrated circuits. The V-groove isolation technique is not acceptable for the large scale production of memory or logic devices.

OBJECTS AND BRIEF STATEMENT OF THE INVENTION

Accordingly, it is a general object of the present invention to provide a novel method for completely isolating islands of silicon from an underlying substrate material.

It is a more specific object of the invention to provide such a method which results in an isolated structure having good mechanical and electrical properties.

It is a further object of the invention to provide a novel method for completely isolating active regions which is well-suited for the large scale production of integrated circuits.

Briefly, in accordance with the present invention, these objects and their attendant advantages are achieved by utilizing the different etch responsiveness of a buried region to form a submerged wall insulating layer between a substrate and an active area. After a standard buried layer has been formed in a subtrate through conventional techniques, for example epitaxial processing, a trench is cut into the epitaxial layer to provide access to the buried layer. Then, while suspending in place the portion of the epitaxial layer surrounded by the trench, for example by means of an oxide bridge, the underlying region of the buried layer is etched away to form a cavity under the active area. This cavity, as well as the surrounding trench, is filled with a suitable insulating material to thereby completely isolate the active island from the substrate.

In addition to electrically isolating the active island from the substrate, the semiconductor structure which is formed in accordance with the present invention exhibits good mechanical properties. More particularly, the isolated island can float relative to the substrate, so that any differences in thermal expansion between the semiconductor substrate, the active island and the isolating region can be accommodated without generating the types of stresses that would normally occur at the connection between the substrate and the active region.

Further features and advantages of the invention are explained in greater detail hereinafter with reference to a specific embodiment of the invention illustrated in the accompanying drawings.

DESCRIPTION OF THE ILLUSTRATED EMBODIMENT

Figure 1:
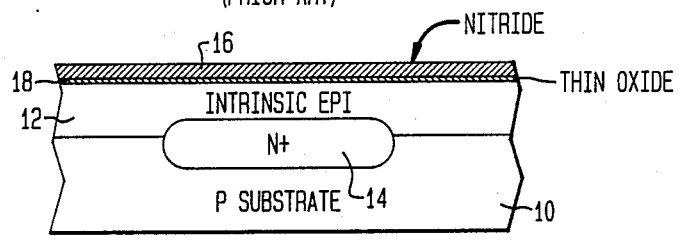
FIG. 1 is a cross-sectional side view of a silicon wafer having a buried layer between the substrate and an epitaxial layer.

The present invention is based upon the etch selectivity of a buried semiconductor layer to form a submerged wall for isolating a semiconductor island from an underlying substrate. An example of the type of semiconductor wafer upon which the process of the present invention can be carried out is illustrated in FIG. 1. This wafer comprises a p-doped substrate 10 upon which is grown an intrinsic epitaxial layer 12 of single crystalline silicon. Sandwiched between the substrate and the epitaxial layer 12 is an N+ buried layer 14. This buried layer can be formed using any conventional technique, for example by diffusing the N+ layer into the substrate before the epitaxial layer is grown, or by selectively growing the N+ type layer using masked epitaxial techniques. The wafer can be provided with a passivating layer of nitride 16 to prevent unwanted oxidation. Typically, a thin layer of oxide 18 is provided between the nitride layer 16 and the semiconductor material to relieve thermal stresses at the silicon/nitride interface.

Figure 2:
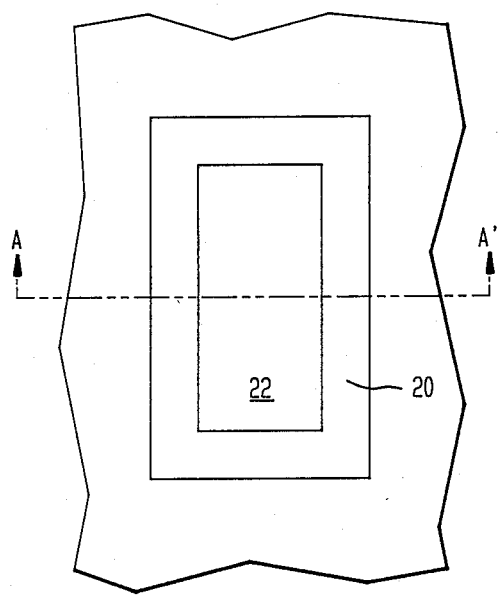
FIGS. 2 through 13 comprise a sequence of views of the semiconductor wafer illustrating each of the steps for submerged wall isolation of a semiconductor region in accordance with the present invention.
Figure 2A:
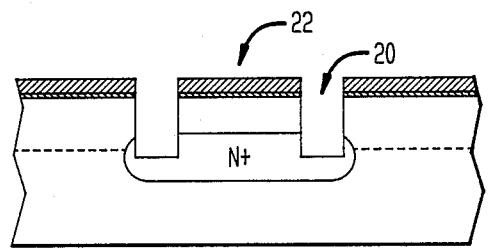

In accordance with the present invention, the buried layer 14 is patterned to conform to the regions of the epitaxial layer 12 which will comprise the active device islands. To isolate the portion of the epitaxial layer which overlies the buried layer, a trench 20 is first cut through the epitaxial layer to a depth sufficient to provide access to the buried layer. FIG. 2 illustrates a top view of the trench and FIG. 2A comprises a cross-sectional side view of the wafer, taken along the line AA of FIG. 2. The area 22 within the trench includes the portion of the epitaxial layer that will eventually form the isolated island As can be seen in FIG. 2A, the trench extends into the buried layer 14 so as to provide the necessary access thereto. If desired, the trench 20 and the buried layer 14 can be relatively dimensioned so that the outer walls of the trench are normally located within the outer boundary of the buried layer, as shown in FIG. 2A. This configuration provides a degree of tolerance which ensures that the trench will not lie outside of the buried layer in case of slight mask misalignment.

Figure 3:
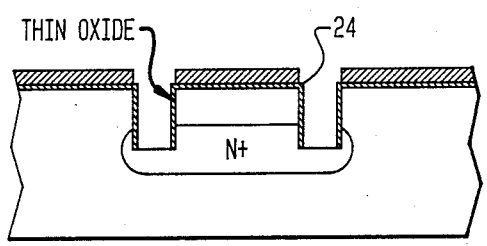
Figure 4:
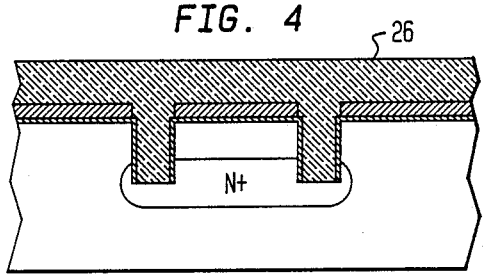
Figure 5:
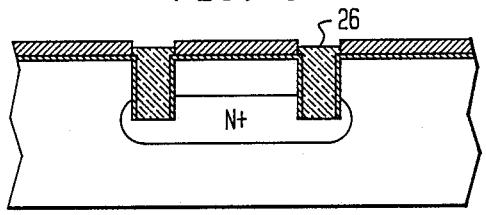

Referring now to FIG. 3, a thin film of oxide 24 is deposited along the side walls of the trench. In practice, this thin film can be formed by thermally growing oxide on the entire inner surface of the trench and anisotropically etching the oxide to remove it from the bottom walls of the trench. The trench is then filled with a suitable support material. Referring to FIGS. 4 and 5, the filling of the trench can be accomplished by depositing a suitable glass 26, such as PVXII disclosed in U.S. Pat. No. 4,417,914, over the entire structure, heating the glass to planarize it, and then etching the glass layer back until the nitride layer 16 is exposed. As a result, the glass material 26 is present only within the opening formed by the trench.

Figure 6:
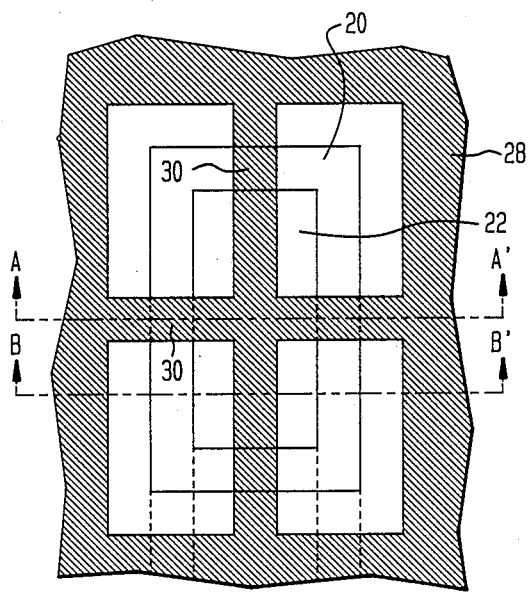
Figure 6A:
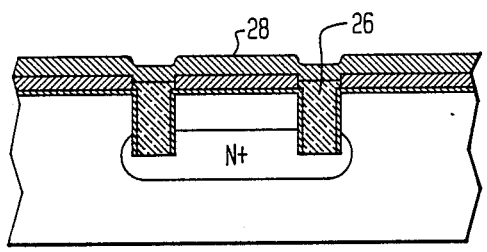
Figure 6B:
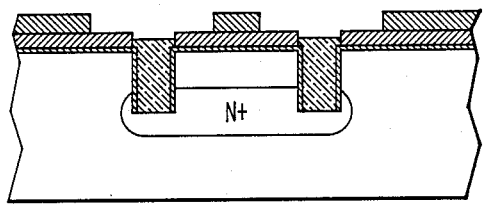

After the trench has been filled, a layer 28 of oxide is deposited on the structure, for example by means of chemical vapor deposition. This layer is then appropriately masked and etched to form a structure such as that shown in FIG. 6. Basically, the etching of the oxide layer 28 is intended to expose some, but not all, of the glass-filled trench 20. The portion of the oxide layer 28 which remains after the etching includes suitable legs 30 that form a bridge over the trench between the island region 22 and the field region of the semiconductor structure which surrounds the trench. FIGS. 6A and 6B comprise cross-sectional side views of the wafer respectively taken along the section lines AA and BB of FIG. 6.

Figure 7A:
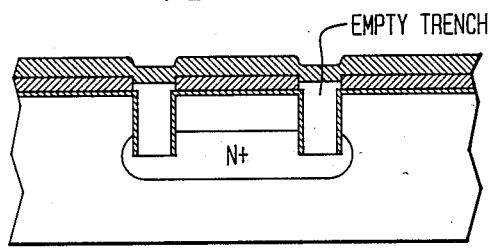
Figure 7B:
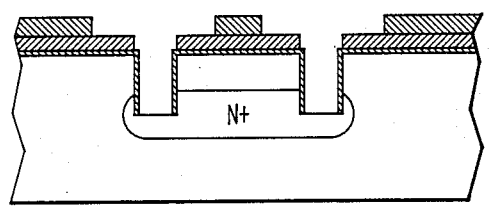

With a portion of the trench now exposed, the glass filler material 26 is removed by means of a selective etch. For example, if the glass filler material comprises PVXII, it can be rapidly removed by a 10:1 HF mixture. The oxide layer 28 is not attacked appreciably by the etchant for the glass filler 26, so that the bridge structure remains suspended over the empty trench, as illustrated in FIGS. 7A and 7B.

Figure 8A:
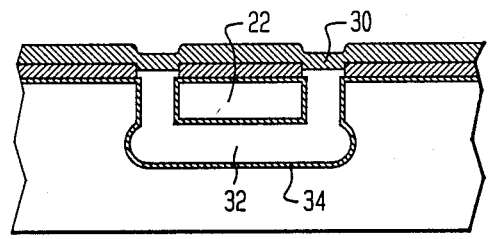
Figure 8B:
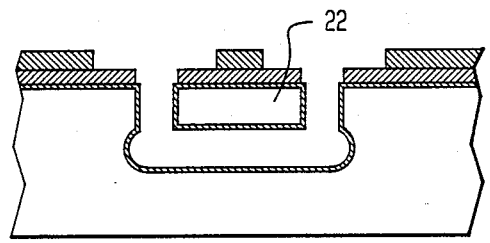

The removal of the filler material from the trench once again exposes the buried layer 14. Another specific etch is then applied to selectively remove this buried layer from below the intrinsic layer of epitaxial silicon. For example, if the buried layer 14 has an N+ impurity concentration, a wet etch comprised of $HF:HNO_3:H_2O$ can be used to remove this layer and form a cavity 32 beneath the island. FIGS. 8A and 8B are cross-sectional side views of the wafer (taken along the section lines A—A and B—B of FIG. 6) after completion of the wet etch. As can be seen, the silicon island 22 is completely free of the substrate, and the oxide bridges 30 form a mechanical support which suspends the island in place.

Figure 9A:
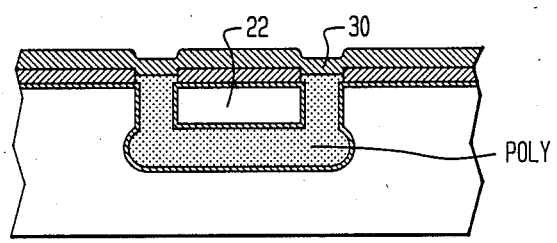
Figure 9B:
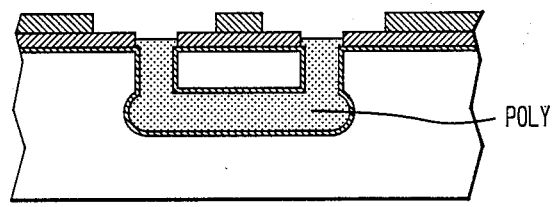

The walls of the cavity 32 are then passivated with a thin film of oxide 34, and undoped polysilicon is deposited on the structure so as to fill the cavity 32 and the trench 20. The polysilicon can be etched back to result in a structure such as that shown in FIGS. 9A and 9B.

Figure 10:
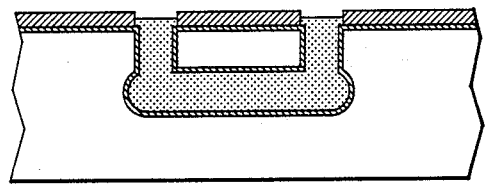
Figure 11:
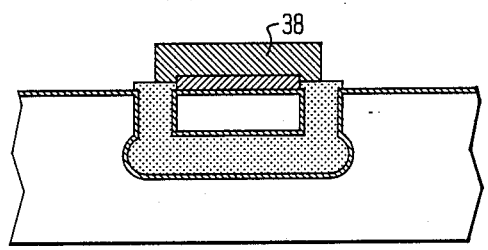
Figure 12:
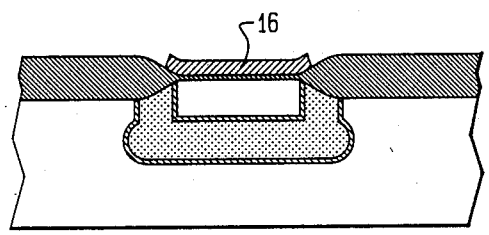
Figure 13:
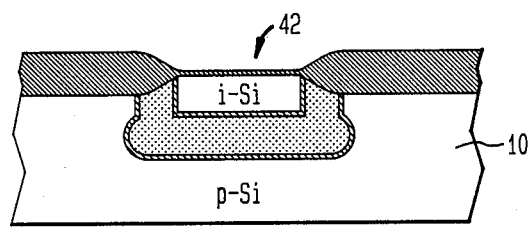

With the island 22 now being supported by the insulating polysilicon layer, the oxide suspension layer 28 can be removed, as shown in FIG. 10. Then, an isolation mask 38 of photoresist material is formed over the island region 22 and the field portion of the nitride layer 16 is removed, as shown in FIG. 11. Field oxide 40 is then provided as shown in FIG. 12, using any conventional technique, and finally the remaining portion of the nitride layer 16 is removed and a thin oxide etch is carried out to expose the epitaxial silicon in the island region 22. The resulting structure comprises an island region 42 that is fully isolated from the underlying substrate 10 by a layer of insulating material extending continuously from the field oxide on one side of the island, beneath the island and along the opposite side to the field oxide. Standard bipolar, MOS or CMOS technology can then be applied to create device structures within the fully isolated silicon island.

Several benefits are provided by completely isolating the island from the substrate in accordance with the invention. For example, increased device speed can be obtained due to the greatly reduced capacitance between the device and the substrate. Similarly, because the island is dielectrically isolated from the substrate, charges that are generated in the substrate by alpha radiation particles will not adversely affect active devices. In addition, since the island is physically separate from the substrate, it can float relative to the substrate and thereby alleviate stresses which might otherwise occur because of differences in rates of thermal expansion of the different materials. Furthermore, the resulting structure lends itself to novel device technologies that have not been obtainable in the past, such as complementary bipolar arrangements.

It will be appreciated by those of ordinary skill in the art that the present invention can be embodied in other specific form without departing from the spirit or essential characteristics thereof. For example, although specific materials have been disclosed with respect to each of the process steps, it will be appreciated that suitable equivalents can be employed with similar degrees of success. The buried layer 14 can have any composition which results in an etch responsiveness that is different from that of the surrounding substrate, as long as it does not interfere with the growth of the epitaxial layer 12. Similarly, although PVXII glass has been disclosed as a specific material which is suitable for the filling of the trenches during the formation of the bridging structure, any material which is capable of being etched out of the trench without removing the suspension structure or the sidewall oxidation of the trenches can be employed. Likewise, although undoped polysilicon is a preferred material for filling the cavity because it is less likely to form voids than other insulators, different materials might also prove to be suitable. In fact, the formation of small voids within the cavity or the trench may not be disadvantageous, since they would still serve in the function of dielectrically isolating the island from the substrate. However, to reduce the likelihood of void formation it is preferable to dimension the trench 20 so that its width is greater than the height of the buried layer 14. This arrangement is more likely to assure complete filling of the cavity by the insulating material.

Although the illustrated embodiment discloses a trench which completely surrounds the island region, it need not have such a configuration. For example, if the island region is significantly longer than it is wide, it may be sufficient to provide trenches only along the two longer sides of the region. These trenches will still provide access to an underlying buried layer and, from a practical standpoint, the resulting structure would be almost as beneficial as a completely isolated island since it would be joined to the substrate only by two small strips of silicon at opposite ends of the island. These two small strips could also support the island during formation of the cavity and thereby eliminate the need for the oxide bridge structure.

In another variation of the invention, the suspending structure 28, 30 need not be an oxide layer which is removed subsequent to the filling of the cavity. Rather, it might comprise polysilicon bars that remain on the wafer and eventually become a component of the ultimate circuit.

Accordingly, the presently disclosed embodiment is considered in all respects to be illustrative and not restrictive. The scope of the invention is indicated by the appended claims rather than the foregoing description, and all changes that come within the meaning and range of equivalents thereof are intended to be embraced therein.

What is claimed is:

1. A method for completely isolating a silicon island from its support substrate, comprising the steps of:
    growing an epitaxial layer of single-crystalline silicon on a silicon substrate;
    etching material around the border of a desired region of the epitaxial layer and beneath the desired region at the interface of the epitaxial layer and the substrate to form a cavity which completely separates the desired region from the substrate;
    supporting the desired region of the epitaxial layer in place while etching the material beneath said region; and
    introducing an insulating material into said cavity to provide an island of the epitaxial layer which is dielectrically isolated from the substrate.

2. The method of claim 1 wherein the desired region of the epitaxial layer is supported in place during the etching of the material beneath said region by means of a layer which bridges said border.

3. The method of claim 1 wherein a wet etch is employed during at least a portion of said etching step.

4. The method of claim 1 wherein said introducing step includes lining the walls of the cavity with said insulating material.

5. A method for isolating a semiconductor island from a surrounding substrate, comprising the steps of:
    providing a buried region in the substrate, said buried region having a characteristic response to etching that is different from that of said substrate;
    forming a trench in said substrate around the desired area of the island, said trench providing access to said buried region;
    filling said trench with a material having a characteristic response to etching that is different from that of said substrate;
    providing a layer of bridge material over said substrate and the filled trench, and removing a portion of said layer to provide access to said trench while leaving another portion of said layer on said substrate which traverses said trench;
    removing said filler material from said trench; and
    etching said buried region to thereby form a cavity beneath the island while said traversing portion of said bridge layer suspends the island in place, to thereby separate said island from said substrate.

6. The method of claim 5, further comprising the step of introducing an insulator material in said cavity and said trench to hold the island in place while electrically isolating it from said substrate.

7. The method of claim 6 wherein said insulator material is undoped polysilicon.

8. The method of claim 5 wherein said trench extends at least partially into said buried region.

9. The method of claim 5, further comprising the steps of:
    lining opposite walls of said trench and said cavity with layers of oxide, and
    depositing a material between said oxide lining layers, to fill the remainder of said cavity.

10. The method of claim 9 wherein said deposited material is undoped polysilicon.

11. The method of claim 5 wherein said filler material is a glass.

12. The method of claim 5 wherein said bridge material comprises an oxide.

13. The method of claim 5 wherein said bridge material comprises polysilicon.

* * * * *